United States Patent
Tsuchikawa et al.

(10) Patent No.: US 9,603,244 B2
(45) Date of Patent: Mar. 21, 2017

(54) THERMOSETTING RESIN COMPOSITION AND PREPREG AND LAMINATE OBTAINED WITH THE SAME

(75) Inventors: Shinji Tsuchikawa, Ibaraki (JP); Tomohiko Kotake, Ibaraki (JP); Masanori Akiyama, Ibaraki (JP)

(73) Assignee: HITACHI CHEMICAL COMPANY, LTD, Tokyo (JP)

( * ) Notice: Subject to any disclaimer, the term of this patent is extended or adjusted under 35 U.S.C. 154(b) by 1260 days.

(21) Appl. No.: 12/443,260

(22) PCT Filed: Sep. 10, 2007

(86) PCT No.: PCT/JP2007/067596
§ 371 (c)(1),
(2), (4) Date: Feb. 12, 2010

(87) PCT Pub. No.: WO2008/041453
PCT Pub. Date: Apr. 10, 2008

(65) Prior Publication Data
US 2010/0143728 A1    Jun. 10, 2010

(30) Foreign Application Priority Data

Sep. 29, 2006   (JP) ................................. 2006-267301
Oct. 3, 2006    (JP) ................................. 2006-271703
Jun. 21, 2007   (JP) ................................. 2007-163817
Jul. 31, 2007   (JP) ................................. 2007-199097

(51) Int. Cl.
| | |
|---|---|
| *B32B 15/08* | (2006.01) |
| *C08G 59/40* | (2006.01) |
| *H05K 1/03* | (2006.01) |
| *C08G 59/50* | (2006.01) |
| *C08G 73/12* | (2006.01) |
| *C08L 63/00* | (2006.01) |
| *C08L 79/08* | (2006.01) |
| *B32B 15/092* | (2006.01) |
| *B32B 15/14* | (2006.01) |
| *C08L 25/08* | (2006.01) |

(52) U.S. Cl.
CPC ....... *H05K 1/0353* (2013.01); *C08G 59/4042* (2013.01); *C08G 59/5086* (2013.01); *C08G 73/12* (2013.01); *C08G 73/124* (2013.01); *C08L 63/00* (2013.01); *C08L 79/085* (2013.01); *B32B 15/092* (2013.01); *B32B 15/14* (2013.01); *B32B 2260/021* (2013.01); *B32B 2260/046* (2013.01); *C08L 25/08* (2013.01); *Y10T 428/31678* (2015.04)

(58) Field of Classification Search
None
See application file for complete search history.

(56) References Cited

U.S. PATENT DOCUMENTS

| | | | |
|---|---|---|---|
| 4,196,109 A | 4/1980 | Laganis et al. | |
| 4,732,839 A | 3/1988 | Schranz et al. | |
| 4,910,270 A | 3/1990 | Maekawa | |
| 5,212,244 A | 5/1993 | Sugawara et al. | |
| 6,403,220 B1 * | 6/2002 | Brennan et al. | 428/413 |
| 6,534,181 B2 * | 3/2003 | Luttrull | 428/416 |
| 7,208,539 B2 | 4/2007 | Tsuchikawa et al. | |
| 8,022,140 B2 * | 9/2011 | Tikart et al. | 525/117 |
| 2002/0006515 A1 | 1/2002 | Luttrull | |
| 2005/0234173 A1 * | 10/2005 | Tsuchikawa et al. | 524/415 |

FOREIGN PATENT DOCUMENTS

| | | |
|---|---|---|
| DE | 3839105 A1 | 6/1989 |
| JP | 49-109476 | 10/1974 |
| JP | 52-051499 | 4/1977 |
| JP | 55-007861 | 1/1980 |
| JP | 57-028129 | 2/1982 |
| JP | 57-038851 | 3/1982 |
| JP | 60-210685 | 10/1985 |
| JP | 62-61051 | 3/1987 |
| JP | 62109817 A * | 5/1987 |
| JP | 62-132915 | 6/1987 |

(Continued)

OTHER PUBLICATIONS

Japanese Official Action issued on Mar. 21, 2012, in JP Application No. 2007-204363.
Japanese Official Action issued on Sep. 4, 2012, in JP Application No. 2007-204363.
Invitation to Respond to Written Opinion mailed May 20, 2015, in connection with Singapore Patent Application No. 2011088424; 2 pages.
Written Opinion mailed May 5, 2015, in connection with Singapore Patent Application No. 2011088424-4; 11 pages.
Machine translation of JP 57-038851.
Machine translation of JP 62-109817.

*Primary Examiner* — Monique Jackson
(74) *Attorney, Agent, or Firm* — Fitch, Even, Tabin & Flannery, LLP

(57) ABSTRACT

The present invention provides a thermosetting resin composition comprising (A) a curing agent having an acidic substituent and an unsaturated maleimide group which is produced by a specific method, (B) a 6-substituted guanamine compound and/or dicyandiamide, (C) a copolymer resin comprising specific monomer units and (D) an epoxy resin and a prepreg and a laminated plate which are prepared by using the same. The thermosetting resin composition of the present invention is balanced in all of a copper foil adhesive property, a heat resistance, a moisture absorption, a flame resistance, a metal-stuck heat resistance, a relative dielectric constant and a dielectric loss tangent. They have a low toxicity and are excellent in a safety and a working environment, and therefore a prepreg and a laminated plate which have excellent performances are obtained by using the above thermosetting resin composition.

14 Claims, No Drawings

(56) References Cited

FOREIGN PATENT DOCUMENTS

| | | |
|---|---|---|
| JP | 62-46584 | 10/1987 |
| JP | 63-34899 | 7/1988 |
| JP | 64-004635 | 1/1989 |
| JP | 01-221413 | 9/1989 |
| JP | 02-185516 | 7/1990 |
| JP | 02-185517 | 7/1990 |
| JP | 02-258820 | 10/1990 |
| JP | 03-145476 | 6/1991 |
| JP | 06-8342 | 2/1994 |
| JP | 06-032969 | 2/1994 |
| JP | 09-25349 | 1/1997 |
| JP | 10-017685 | 1/1998 |
| JP | 10-017686 | 1/1998 |
| JP | 10-067942 | 3/1998 |
| JP | 10-505376 | 5/1998 |
| JP | 2001-011672 | 1/2001 |
| JP | 2007-186675 | 7/2007 |
| WO | WO 96/07683 | 3/1996 |
| WO | WO 03/087230 A1 | 10/2003 |

\* cited by examiner

THERMOSETTING RESIN COMPOSITION AND PREPREG AND LAMINATE OBTAINED WITH THE SAME

BACKGROUND OF THE INVENTION

The present invention relates to a thermosetting resin composition which is balanced in all of a metal foil adhesive property, a heat resistance, a moisture resistance, a flame resistance, a metal-stuck heat resistance and dielectric characteristics (a relative dielectric constant and a dielectric loss tangent), low in a toxicity and excellent in a safety and a working environment and which is suitably used for electronic parts and the like and a prepreg and a laminated plate which are prepared by using the same.

RELATED ART

Thermosetting resins are widely used in the fields of electronic parts and the like to which a high reliability is required since a specific cross-linking structure thereof displays a high heat resistance and a high dimensional stability. Particularly in copper clad laminated plates and interlayer insulating materials, a high copper foil adhesive property for forming fine wirings and a workability in carrying out works such as boring and the like by drilling and punching are required as well in order to meet requirements for density growth in recent years.

Mounting of electronic parts produced by using lead-free solders and flame retardation free of halogens are required due to environmental problems in recent years, and this requires the higher heat resistance and the higher flame retardation than those of conventional ones. Further, in order to enhance a safety of the products and the working environment, desired is a thermosetting resin composition which is constituted only from components having a low toxicity and which does not generate toxic gases and the like.

A bismaleimide compound is a curing agent for thermosetting resins which are excellent in dielectric characteristics, a flame resistance and a heat resistance. Publicly known bismaleimide compounds do not have a curing reactivity with epoxy resins, and therefore when they are used as they are for thermosetting resins of an epoxy curing base, the problem that the heat resistance is short has been involved therein. That is, disclosed are cases (patent documents 1 to 2) regarding thermosetting resins in which adducts of bismaleimide compounds and aminophenol are produced by heating and kneading without using solvents and used. However, a yield of the adducts of the bismaleimide compounds and aminophenol is low, and when they are used for copper clad laminated plates and interlayer insulating materials, the heat resistance, the workability and the like are short.

Melamine resins which are thermosetting resins and guanamine compounds are excellent in an adhesive property, a flame resistance and a heat resistance, but they are short of a solubility in organic solvents, and there have been involved therein the problems that it is difficult to produce thermosetting resin compositions without using a large amount of nitrogen atom-containing organic solvents such as N,N-dimethylformamide and the like which are highly toxic and that the storage stability is short. Further, copper clad laminated plates and interlayer insulating materials which are prepared by using the above thermosetting resins have involved the problem that they contaminate various chemical liquids such as a plating liquid and the like when producing electronic parts and the like.

A lot of cases regarding thermosetting resins prepared by using melamine resins and guanamine compounds are known as resins for solving the above problems (patent documents 3 to 7).

They are thermosetting resins prepared by condensing melamine resins and guanamine compounds using aldehydes such as formaldehyde and the like and improved in a solubility in organic solvents, but they have a low thermal decomposition temperature and generate toxic cracked gases, so that they deteriorate the working environment and are short of a heat resistance against lead-free solders and a copper-stuck heat resistance which are required in recent years. Further, in fine working treatment and formation of wirings, they are short of a copper foil adhesive property, a flexibility and a toughness, and brought about are the failures that the circuit patterns are broken or peeled and that cracks are produced in carrying out works such as boring and the like by drilling and punching.

Also, a case (patent document 8) regarding methyloled guanamine resins is disclosed, but problems on the heat resistance, the adhesive property, the workability and the like are involved therein as is the case with those described above.

Further, disclosed is a case (patent document 9) regarding thermosetting resins prepared by using adducts of bismaleimide compounds produced without using an organic solvent and aminobenzoic acid, benzoguanamine formaldehyde condensation products and the like, but they have a low thermal decomposition temperature and are short of a heat resistance against lead-free solders and a copper-stuck heat resistance which are required in recent years.

A flexible printed wiring board (patent document 10) prepared by a copolymer resin comprising styrene and maleic anhydride and the like is disclosed as a case of a resin composition prepared by using a copolymer resin containing maleic anhydride using an epoxy resin as a curing agent or a laminated plate. Also, disclosed is an epoxy resin compound (patent document 11) comprising a copolymer resin having an acid value of 280 or more which is obtained from an epoxy resin, an aromatic vinyl compound and maleic anhydride and dicyandiamide. Further, disclosed are a prepreg comprising a brominated epoxy resin, a copolymer resin (epoxy resin curing agent) of styrene and maleic anhydride, a styrene base compound and a solvent and an electric laminated plate material (patent document 12), a prepreg comprising an epoxy resin, a copolymer resin of an aromatic vinyl compound and maleic anhydride and a phenol compound and an electric laminated plate material (patent document 13), a prepreg comprising an epoxy resin, a copolymer resin of an aromatic vinyl compound and maleic anhydride, a phenol compound and styrene or a styrene low polymer and an electric laminated plate material (patent document 14) and a resin composition comprising an epoxy resin, a cross-linking agent for a carboxylic anhydride type epoxy resin and an allyl network-forming compound, a laminated plate and a printed wiring board (patent document 15).

However, they have unsatisfactory performances in dielectric characteristics, a high heat resistance, a high moisture resistance and a high adhesive property with a copper foil which are required as miniaturization of the patterns and shift of the signals to a higher frequency are advanced.

Patent document 1: Japanese Patent Publication No. 34899/1988

Patent document 2: Japanese Patent Application Laid-Open No. 32969/1994

Patent document 3: Japanese Patent Publication No. 46584/ 1987
Patent document 4: Japanese Patent Application Laid-Open No. 67942/1998
Patent document 5: Japanese Patent Application Laid-Open No. 11672/2001
Patent document 6: Japanese Patent Application Laid-Open No. 258820/1990
Patent document 7: Japanese Patent Application Laid-Open No. 145476/1991
Patent document 8: Japanese Patent Publication No. 61051/ 1987
Patent document 9: Japanese Patent Publication 8342/1994
Patent document 10: Japanese Patent Application Laid-Open No. 109476/1974
Patent document 11: Japanese Patent Application Laid-Open No. 221413/1989
Patent document 12: Japanese Patent Application Laid-Open No. 25349/1997
Patent document 13: Japanese Patent Application Laid-Open No. 17685/1998
Patent document 14: Japanese Patent Application Laid-Open No. 17686/1998
Patent document 15: Japanese Patent Application Laid-Open (through PCT) No. 505375/1998

DISCLOSURE OF THE INVENTION

In light of the above existing situations, an object of the present invention is to provide a thermosetting resin composition which is balanced in all of a metal foil adhesive property, a heat resistance, a moisture resistance, a flame resistance, a metal-stuck heat resistance, a relative dielectric constant and a dielectric loss tangent and a prepreg and a laminated plate which are prepared by using the same.

Intensive researches repeated by the present inventors in order to achieve the object described above have resulted in finding that a thermosetting resin composition comprising a curing agent having an acidic substituent and an unsaturated maleimide group which is produced by a specific method (hereinafter referred to merely as the curing agent), a 6-substituted guanamine compound, a copolymer resin comprising a specific monomer unit and an epoxy resin meets the object described above and that it is advantageously used as a thermosetting resin composition for a laminated plate. The present invention has been completed based on the above knowledge.

That is, the present invention provides a thermosetting resin composition, a prepreg and a laminated plate each shown below.

1. A thermosetting resin composition comprising:
   (A) a curing agent having an acidic substituent and an unsaturated maleimide group which is produced by reacting (a-1) a maleimide compound having at least two N-substituted maleimide groups in a molecule with (a-2) an amine compound having an acidic substituent represented by the following Formula (1) in an organic solvent,
   (B) a 6-substituted guanamine compound represented by the following Formula (2) and/or dicyandiamide,
   (C) a copolymer resin comprising (c-1) a monomer unit represented by the following Formula (3) and (c-2) a monomer unit represented by the following Formula (4) and
   (D) an epoxy resin having at least two epoxy groups in a molecule:

[Ka 1]

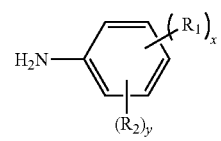

(wherein $R_1$ each represents independently an acidic substituent selected from a hydroxyl group, a carboxy group and a sulfonic acid group; $R_2$ each represents independently a hydrogen atom, an aliphatic hydrocarbon group having 1 to 5 carbon atoms or a halogen atom; x is an integer of 1 to 5, and y is an integer of 0 to 4; and a sum of x and y is 5);

[Ka 2]

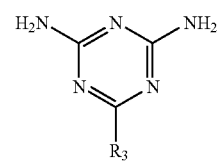

(wherein $R_3$ represents phenyl, methyl, allyl, butyl, methoxy or benzyloxy);

[Ka 3]

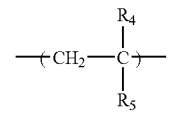

(wherein $R_4$ and $R_5$ each represent independently a hydrogen atom, a halogen atom, a hydrocarbon group having 1 to 5 carbon atoms, a phenyl group or a substituted phenyl group);

[Ka 4]

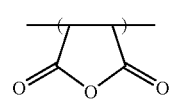

2. The thermosetting resin composition according to the above item 1, wherein the curing agent (A) is a compound represented by the following Formula (5) or the following Formula (6):

[Ka 5]

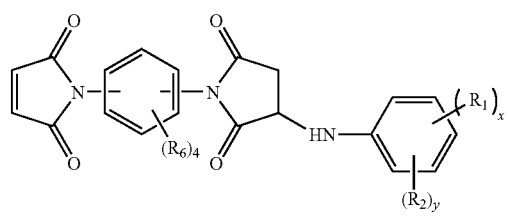

(wherein $R_1$, $R_2$, x and y represent the same ones as in Formula (1); $R_6$ each represents independently a hydrogen atom, an aliphatic hydrocarbon group having 1 to 5 carbon atoms or a halogen atom):

[Ka 6]

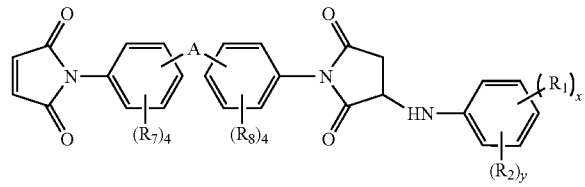

(6)

(wherein $R_1$, $R_2$, x and y represent the same ones as in Formula (1); $R_7$ and $R_8$ each represent independently a hydrogen atom, an aliphatic hydrocarbon group having 1 to 5 carbon atoms or a halogen atom; and A is an alkylene group, an alkylidene group, an ether group, a sulfonyl group or a group represented by the following Formula (7);

[Ka 7]

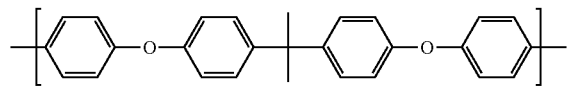

(7)

3. A prepreg obtained by impregnating or coating a base material with the thermosetting resin composition according to the above item 1 or 2 and then subjecting it to a B stage.
4. A laminated plate obtained by laminating and molding the prepreg according to the above item 3.
5. The laminated plate according to the above item 4, wherein it is a metal clad laminated plate obtained by superposing a metal foil on one side of the prepreg and then heating, pressing and molding it.

The thermosetting resin composition of the present invention is balanced in all of a metal foil adhesive property, a heat resistance, a moisture resistance, a flame resistance, a metal-stuck heat resistance, a relative dielectric constant and a dielectric loss tangent, and it has a low toxicity and is excellent as well in a safety and a working environment.

Accordingly, a prepreg and a laminated plate which have excellent performances can be provided by the present invention using the above thermosetting resin composition.

BEST MODE FOR CARRYING OUT THE INVENTION

The present invention shall be explained below in details. First, the curing agent of the component (A) in the thermosetting resin composition of the present invention is a curing agent having an acidic substituent and an unsaturated maleimide group which is produced by reacting (a-1) a maleimide compound having at least two N-substituted maleimide groups in a molecule with (a-2) an amine compound having an acidic substituent represented by the following Formula (1) in an organic solvent:

[Ka 8]

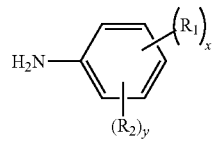

(1)

(wherein $R_1$ each represents independently an acidic substituent selected from a hydroxyl group, a carboxy group and a sulfonic acid group; $R_2$ represents a hydrogen atom, an aliphatic hydrocarbon group having 1 to 5 carbon atoms or a halogen atom; x is an integer of 1 to 5, and y is an integer of 0 to 4; and a sum of x and y is 5).

The maleimide compound (a-1) having at least two N-substituted maleimide groups in a molecule includes, for example, bis(4-maleimidephenyl)methane, poly(maleimidephenyl)methane, bis(4-maleimidephenyl) ether, bis(4-maleimidephenyl)sulfone, 3,3-dimethyl-5,5-ethyl-4,4-diphenylmethanebismaleimide, 4-methyl-1,3-phenylnebismaleimide, m-phenylenebismaleimide, 2,2-bis[4-(4-maleimidephenoxy)phenyl]propane and the like. Among them, bis(4-maleimidephenyl)methane, m-phenylenebismaleimide and bis(4-maleimidephenyl)sulfone which have a high reactivity and can provide the thermosetting resin composition with a higher heat resistance are preferred, and m-phenylenebismaleimide and bis(4-maleimidephenyl)methane are more preferred from the viewpoint that they are inexpensive. Bis(4-maleimidephenyl)methane is particularly preferred in terms of a solubility in solvents.

The amine compound (a-2) represented by Formula (1) includes, for example, m-aminophenol, p-aminophenol, o-aminophenol, p-aminobenzoic acid, m-aminobenzoic acid, o-aminobenzoic acid, o-aminobenzenesulfonic acid, m-aminobenzenesulfonic acid, p-aminobenzenesulfonic acid, 3,5-dihydroxyaniline, 3,5-dicarboxyaniline and the like, and among them, m-aminophenol, p-aminophenol, p-aminobenzoic acid, m-aminobenzoic acid and 3,5-dihydroxyaniline are preferred from the viewpoints of a solubility and a yield in the synthesis. m-Aminophenol and p-aminophenol are more preferred from the viewpoint of a heat resistance, and m-aminophenol is particularly preferred from the viewpoint that it has a low toxicity.

In respect to a use ratio of the maleimide compound (a-1) to the amine compound (a-2), an equivalent ratio of an equivalent of a maleimide group in the maleimide compound (a-1) to an equivalent of the amine compound (a-2) in terms of a —$NH_2$ group falls preferably in a range represented by the following equation:

1.0≤(equivalent of maleimide group)/(equivalent in terms of a —$NH_2$ group)≤10.0 and the above equivalent ratio falls more preferably in a range of 2.0 to 10.0. The above equivalent ratio falling in the range described above prevents the thermosetting resin from being short of a solubility in a solvent and the gelation from being brought about and prevents the thermosetting resin from being reduced in a heat resistance.

The organic solvent used in the above reaction shall not specifically be restricted and includes, for example, alcohol base solvents such as ethanol, propanol, butanol, methyl cellosolve, butyl cellosolve, propylene glycol monomethyl ether and the like, ketone base solvents such as acetone, methyl ethyl ketone, methyl isobutyl ketone, cyclohexanone and the like, ether base solvents such as tetrahydrofuran and the like, aromatic solvents such as toluene, xylene, mesitylene and the like, nitrogen-containing solvents such as dimethylformamide, dimethylacetamide, N-methylpyrrolidone and the like, sulfur-containing solvents such as dimethyl sulfoxide and the like. They can be used alone or in a mixture of two or more kinds thereof.

Among the above organic solvents, cyclohexanone, propylene glycol monomethyl ether and methyl cellosolve are preferred in terms of a solubility, and cyclohexanone and propylene glycol monomethyl ether are more preferred in terms of a low toxicity. Propylene glycol monomethyl ether which has a high volatility and is less liable to remain as a residual solvent in producing the prepreg is particularly preferred.

A use amount of the organic solvent is preferably 10 to 1000 parts by mass, more preferably 100 to 500 parts by mass and particularly preferably 200 to 500 parts by mass per 100 parts by mass of the sum of the maleimide compound (a-1) and the amine compound (a-2).

The reaction temperature is preferably 50 to 200° C., more preferably 100 to 160° C. The reaction time is preferably 0.1 to 10 hours, more preferably 1 to 8 hours.

A catalyst can optionally be used, if necessary, in the above reaction. The reaction catalyst shall not specifically be restricted and includes, for example, amines such as triethylamine, pyridine, tributylamine and the like, imidazoles such as methylimidazole, phenylimidazole and the like and phosphorus base catalysts such as triphenylphosphine and the like. They can be used alone or in a mixture of two or more kinds thereof.

A curing agent having an acidic substituent and an unsaturated maleimide group represented by the following Formula (5) or Formula (6) is synthesized by reacting a bis(4-maleimidephenyl) compound used as the maleimide compound (a-1) with the amine compound (a-2) according to the above reaction:

[Ka 9]

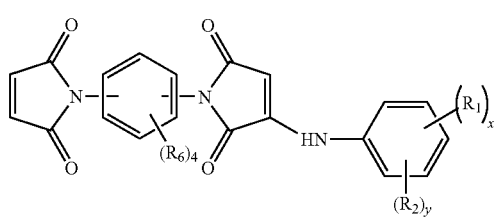

(5)

(wherein $R_1$, $R_2$, x and y represent the same ones as in Formula (1); $R_6$ each represents independently a hydrogen atom, an aliphatic hydrocarbon group having 1 to 5 carbon atoms or a halogen atom):

[Ka 10]

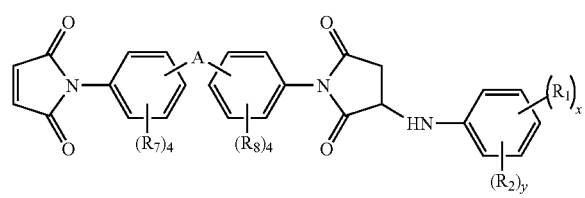

(6)

(wherein $R_1$, $R_2$, x and y represent the same ones as in Formula (1); $R_7$ and $R_8$ each represent independently a hydrogen atom, an aliphatic hydrocarbon group having 1 to 5 carbon atoms or a halogen atom; and A is an alkylene group, an alkylidene group, an ether group, a sulfonyl group or a group represented by the following Formula (7);

[Ka 11]

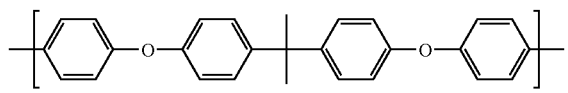

(7)

The component (B) in the thermosetting resin composition of the present invention is a 6-substituted guanamine compound represented by the following Formula (2) and/or dicyandiamide. The 6-substituted guanamine compound represented by Formula (2) includes, for example, 2,4-diamino-6-phenyl-s-triazine called benzoguanamine, 2,4-diamino-6-methyl-s-triazine called acetoguanamine, 2,4-diamino-6-vinyl-s-triazine and the like. Among them, benzoguanamine and 2,4-diamino-6-vinyl-s-triazine which have a high reactivity in the reaction and which can provide the resin composition with a higher heat resistance are more preferred, and benzoguanamine is particularly preferred from the viewpoint that it has a low toxicity and a low cost. Benzoguanamine is widely used for industrial uses and excellent, though inexpensive, in an adhesive property, a heat resistance and a curing property.

[Ka 12]

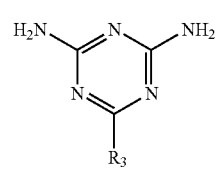

(2)

wherein $R_3$ represents phenyl, methyl, allyl, butyl, methoxy or benzyloxy.

The component (C) in the thermosetting resin composition of the present invention is a copolymer resin comprising (c-1) a monomer unit represented by the following Formula (3) and (c-2) a monomer unit represented by the following Formula (4):

[Ka 13]

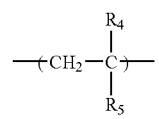

(3)

(wherein $R_4$ and $R_5$ each represent independently a hydrogen atom, a halogen atom, a hydrocarbon group having 1 to 5 carbon atoms, a phenyl group or a substituted phenyl group);

[Ka 14]

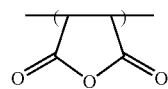

(4)

The monomer unit (c-1) represented by Formula (3) is obtained from a styrene compound such as styrene, 1-methylstyrene, vinyltoluene, dimethylstyrene, chlorostyrene, bromolstyrene and the like and a vinyl compound such as ethylene, propylene, isobutylene and the like, and two or more kinds of the monomers may be used, if necessary, in a mixture.

The monomer unit (c-2) represented by Formula (4) is obtained from maleic anhydride.

Various polymerizable monomer units in addition to the monomer units described above may be contained in the copolymer resin of the component (C), and monomers from which the above various monomer units (c-3) are obtained include, for example, maleimide compounds such as N-phenylmaleimide, N-hydroxyphenylmaleimide, N-carboxyphenylmaleimide, N-cyclohexylmaleimide and the like and compounds having a methacryloyl group or an acryloyl group such as methyl methacrylate, methyl acrylate and the like. The maleimide compounds are preferred from the viewpoints of dielectric characteristics and a flame resistance, and N-phenylmaleimide and N-hydroxyphenylmaleimide are more preferred from the viewpoints of a moisture and heat resistance and an adhesive property.

Assuming a monomer unit number of (c-1) as m, a monomer unit number of (c-2) as n and a monomer unit number of the copolymerizable component (c-c) as r in the copolymer resin of the component (C), a monomer ratio (m/n) in the copolymer resin of the component (C) is preferably 0.8 to 19.0, more preferably 1.0 to 6.0 considering a balance between the dielectric characters, the glass transition temperature, the moisture and heat resistance and the adhesive property.

A weight average molecular weight of the copolymer resin of the component (C) is preferably 1,000 to 200,000 considering a balance of the heat resistance and the mechanical strength with the molding workability. The weight average molecular weight is a value measured by GPC using tetrahydrofuran as an eluent and reduced according to a standard polystyrene calibration curve.

The component (D) in the thermosetting resin composition of the present invention shall not specifically be restricted as long as it is an epoxy resin having two or more epoxy groups in a molecule, and it includes, for example, glycidyl ethers of a bisphenol A base, a bisphenol F base, a biphenyl base, a novolac base, a multifunctional phenol base, a naphthalene base, an alicyclic base and an alcohol base, glycidyl amines, glycidyl esters and the like. They can be used alone or in a mixture of two or more kinds thereof.

Among them, bisphenol F type epoxy resins, dicyclopentadiene type epoxy resins, naphthalene ring-containing epoxy resins, biphenyl type epoxy resins, biphenyl aralkyl type epoxy resins, phenol novolac type epoxy resins and cresol novolac type epoxy resins are preferred from the viewpoints of dielectric characteristics, a heat resistance, a moisture resistance and a metal foil adhesive property, and the dicyclopentadiene type epoxy resins, the biphenyl aralkyl type epoxy resins, the biphenyl type epoxy resins and the phenol novolac type epoxy resins are more preferred from the viewpoints of dielectric characteristics and a high glass transition temperature. The phenol novolac type epoxy resins and the dicyclopentadiene type epoxy resins are particularly preferred from the viewpoint of a moisture and heat resistance.

A curing agent and a curing accelerating agent for an epoxy resin may be used in combination with the thermosetting resin composition of the present invention. The examples of the curing agent for an epoxy resin include acid anhydrides such as maleic anhydride, maleic anhydride copolymers and the like, amine compounds such as dicyanodiamide and the like and phenol compounds such as phenol novolac, cresol novolac and the like. Among them, the phenol compounds such as phenol novolac, cresol novolac and the like which improve the heat resistance are preferred, and the cresol novolac type phenol resins are particularly preferred since the flame resistance and the adhesive property are enhanced.

The examples of the curing accelerating agent for an epoxy resin include imidazoles and derivatives thereof, tertiary amines, quaternary ammonium salts and the like.

The contents of the respective components contained in the thermosetting resin composition of the present invention are set as follows in terms of a mass based on 100 parts by mass of the sum of a mass of the curing agent of the component (A) having an acidic substituent and an unsaturated maleimide group in terms of a solid matter and masses of the components (B) to (D).

The component (A) is set to preferably 1 to 95 parts by mass, more preferably 20 to 95 parts by mass and particularly preferably 20 to 90 parts by mass. Setting a content of the component (A) to 1 part by mass or more enhances the flame resistance, the adhesive property and the flexibility, and setting it to 95 parts by mass or less prevents the heat resistance from being reduced.

The component (B) is set to preferably 1 to 95 parts by mass, more preferably 20 to 95 parts by mass and particularly preferably 20 to 90 parts by mass. Setting a content of the component (B) to 1 part by mass or more enhances the flame resistance, the adhesive property and the dielectric characteristics, and setting it to 95 parts by mass or less prevents the heat resistance from being reduced.

The component (C) is set to preferably 1 to 50 parts by mass, more preferably 1 to 30 parts by mass and particularly preferably 1 to 20 parts by mass. Setting a content of the component (C) to 1 part by mass or more enhances the solubility and the dielectric characteristics, and setting it to 50 parts by mass or less prevents the flame resistance from being reduced.

The component (D) is set to preferably 1 to 95 parts by mass, more preferably 20 to 95 parts by mass and particularly preferably 20 to 90 parts by mass. Setting a content of the component (D) to 1 part by mass or more enhances the flame resistance, the adhesive property and the heat resistance, and setting it to 95 parts by mass or less prevents the dielectric characteristics from being reduced.

An inorganic filler can optionally be added as a component (E) to the thermosetting resin of the present invention. The examples of the inorganic filler include silica, mica, talc, short fibers or fine powders glass and hollow glass, antimony trioxide, calcium carbonate, quartz powder, aluminum hydroxide, magnesium hydroxide and the like. Among them, silica, aluminum hydroxide and magnesium hydroxide are preferred from the viewpoints of the dielectric characteristics, the heat resistance and the flame resistance, and silica and aluminum hydroxide are more preferred since they are inexpensive.

A content of the component (E) is preferably 0 to 300 parts by mass, more preferably 20 to 200 parts by mass and particularly preferably 20 to 150 parts by mass based on 100 parts by mass of the sum of a mass of the curing agent of the component (A) in terms of a solid matter and masses of the components (B) to (D). Setting a content of the component (E) to 300 parts by mass or less prevents the molding property and the adhesive property from being reduced.

Publicly known thermoplastic resins, elastomers, flame retardants, organic fillers and the like can optionally be added as resin compositions to the thermosetting resin composition of the present invention to such an extent that the properties of the thermosetting resin are not damaged.

The examples of the thermoplastic resin include polytetrafluoroethylene, polyethylene, polypropylene, polystyrene, polyphenylene ether resins, phenoxy resins, polycarbonate resins, polyester resins, polyamide resins, polyimide resins, xylene resins, petroleum resins, silicone resins and the like.

The examples of the elastomer include polybutadiene, polyacrylonitrile, epoxy-modified polybutadiene, maleic anhydride-modified polybutadiene, phenol-modified polybutadiene, carboxy-modified polyacrylonitrile and the like.

The examples of the flame retardant include halogen base flame retardants containing bromine and chlorine, phosphorus base flame retardants such as triphenyl phosphate, tricresyl phosphate, trisdichloropropyl phosphate, phosphazene, red phosphorus and the like and flame retardants of inorganic matters such as antimony trioxide, aluminum hydroxide, magnesium hydroxide and the like. The phosphorus base flame retardants used in combination with the flame retardants of inorganic matters such as aluminum hydroxide and the like are particularly preferred from the viewpoints that they are inexpensive and that the flame resistance and the heat resistance are consistent with other characteristics.

The examples of the organic filler include silicone powders, organic powders of polytetrafluoroethylene, polyethylene, polypropylene, polystyrene, polyphenylene ether and the like.

In the thermosetting resin composition of the present invention, an organic solvent can optionally be used as a diluent solvent. The above organic solvent shall not specifically be restricted and includes, for example, ketone base solvents such as acetone, methyl ethyl ketone, methyl isobutyl ketone, cyclohexanone and the like, alcohol base solvents such as methyl cellosolve and the like, ether base solvents such as tetrahydrofuran and the like and aromatic solvents such as toluene, xylene, mesitylene and the like. They can be used alone or in a mixture of two or more kinds thereof.

Further, a UV absorber, an antioxidant, a photopolymerization initiator, a fluorescent whitening agent, an adhesion improving agent and the like can optionally be added as well to the above thermosetting resin composition. They shall not specifically be restricted and include, for example, a UV absorber such as benzotriazoles and the like, an antioxidant such as hindered phenols, styrenated phenols and the like, a photopolymerization initiator such as benzophenones, benzyl ketals, thioxanthones and the like, a fluorescent whitening agent such as stilbene derivatives and the like, a urea compound such as urea silane and the like and an adhesion improving agent such as silane coupling agents and the like.

The prepreg of the present invention is obtained by impregnating or coating a base material with the thermosetting resin composition of the present invention and then subjecting it to a B stage. That is, the base material is impregnated or coated with the thermosetting resin composition of the present invention and then semi-cured (subjected to a B stage) by heating or the like to produce the prepreg of the present invention. The prepreg of the present invention shall be explained below in details.

Known base materials used for laminated plates for various electric insulating materials can be used for the base material used for the prepreg of the present invention. The examples of the material thereof include fibers of inorganic matters such as E glass, D glass, S glass, Q glass and the like, fibers of organic matters such as polyimides, polyesters, polytetrafluoroethylene and the like and mixtures thereof. The above base materials have shapes such as a woven fabric, an unwoven fabric, a roving, a chopped strand mat, a surfacing mat and the like. The material and the shape are selected according to the uses and the performances of the targeted molding, and the material and the shape can be used, if necessary, alone or in combination of two more kinds thereof.

A thickness of the base material shall not specifically be restricted, and the base material having a thickness of, for example, about 0.03 to 0.5 mm can be used. The base materials subjected to surface treatment with a silane coupling agent and the like or mechanically subjected to fiber opening treatment are suited from the viewpoints of a heat resistance, a moisture resistance and a workability. The base material is impregnated or coated with the resin composition so that an adhesion amount of the resin composition is 20 to 90% by mass in terms of a resin content of the prepreg after drying, and then it is semi-cured (subjected to a B stage) by heating and drying usually at a temperature of 100 to 200° C. for 1 to 30 minutes, whereby the prepreg of the present invention can be obtained.

The laminated plate of the present invention can be obtained by laminating and molding the prepreg of the present invention. That is, it is laminated and molded in a constitution in which, for example, 1 to 20 sheets of the prepreg of the present invention are superposed and in which a metal foil of copper, aluminum or the like is disposed on one surface or both surfaces thereof. Conditions in methods of, for example, laminated plates and multilayer plates for electric insulating materials can be applied to the molding conditions thereof, and the laminated plate can be molded in the ranges of a temperature of 100 to 250° C., a pressure of 0.2 to 10 MPa and a heating time of 0.1 to 5 hours by means of, for example, a multistage press, a multistage vacuum press, continuous molding, an autoclave molding machine and the like. Further, the prepreg of the present invention combined with a wiring board for an inner layer is laminated and molded, whereby a multilayer plate can be produced as well.

EXAMPLES

Next, the present invention shall be explained with reference to examples shown below, but the present invention shall not be restricted by these examples.

The performances of copper clad laminated plates obtained in the following examples were measured and evaluated by the following methods.

(1) Evaluation of a Copper Foil Adhesive Property (Copper Foil Peeling Strength)

An evaluation base plate was prepared by dipping a copper clad laminated plate in a copper etching liquid to thereby remove the copper foil allowing a band part having a width of cm to remain, and a peeling strength of the band part was measured by means of an autograph (AG-100C manufactured by Shimadzu Corporation).

(2) Measurement of Glass Transition Temperature (Tg)

An evaluation base plate of 5 mm square was prepared by dipping a copper clad laminated plate in a copper etching liquid to thereby remove the copper foil, and a glass transition temperature thereof was evaluated by observing a thermal expansion characteristic of the evaluation base plate by means of a TMA test equipment (TMA2940 manufactured by Du Pont Co., Ltd.).

(3) Evaluation of a Solder Heat Resistance

An evaluation base plate of 5 mm square was prepared by dipping a copper clad laminated plate in a copper etching liquid to thereby remove the copper foil, and it was left standing on the conditions of 121° C. and 0.2 MPa for 4 hours by means of a pressure cooker test equipment (manufactured by Hirayama Manufacturing Corporation). Next, it was dipped in a solder bath having a temperature of 288° C. for 20 seconds, and then an appearance of the evaluation base plate was observed to thereby evaluate a solder heat resistance.

(4) Evaluation of a Copper-Stuck Heat Resistance (T-288)

An evaluation base plate of 5 mm square was prepared from a copper clad laminated plate, and time passing until blister was generated on the evaluation base plate at 288° C. was measured to thereby evaluate a copper-stuck heat resistance by means of a TMA test equipment (TMA2940 manufactured by Du Pont Co., Ltd.).

(5) Evaluation of a Moisture Absorption (Water Absorption Coefficient)

An evaluation base plate was prepared by dipping a copper clad laminated plate in a copper etching liquid to thereby remove the copper foil, and it was left standing on the conditions of 121° C. and 0.2 MPa for 4 hours by means of a pressure cooker test equipment (manufactured by Hirayama Manufacturing Corporation), and then a water absorption coefficient of the evaluation base plate was measured.

(6) Evaluation of a Flame Resistance

An evaluation base plate was prepared by dipping a copper clad laminated plate in a copper etching liquid to thereby remove the copper foil, and an evaluation base plate was prepared by cutting out from the above evaluation base in a length of 127 mm and a width of 12.7 mm and evaluated according to a test method (V method) of UL94.

(7) Measurement of a Relative Dielectric Constant and a Dielectric Loss Tangent

An evaluation base plate was prepared by dipping a copper clad laminated plate in a copper etching liquid to thereby remove the copper foil, and a relative dielectric constant and a dielectric loss tangent thereof were measured at a frequency of 1 GHz by means of a relative dielectric constant measuring device (manufactured by Hewlett-Packard Company).

Production Example 1

Production of a Curing Agent (A-1)

A reactor having a volume of 2 liter which was equipped with a thermometer, a stirring device and a moisture determining device equipped with a reflux condenser and which could be heated and cooled was charged with 358.0 g of bis(4-maleimidephenyl)methane, 54.5 g of m-aminophenol and 412.5 g of propylene glycol monomethyl ether, and they were reacted for 5 hours while refluxing to obtain a solution of a curing agent (A-1).

Production Example 2

Production of a Curing Agent (A-2)

A reactor having a volume of 2 liter which was equipped with a thermometer, a stirring device and a moisture determining device equipped with a reflux condenser and which could be heated and cooled was charged with 358.0 g of bis(4-maleimidephenyl)methane, 54.5 g of p-aminophenol and 412.5 g of propylene glycol monomethyl ether, and they were reacted for 5 hours while refluxing to obtain a solution of a curing agent (A-2).

Production Example 3

Production of a Curing Agent (A-3)

A reactor having a volume of 2 liter which was equipped with a thermometer, a stirring device and a moisture determining device equipped with a reflux condenser and which could be heated and cooled was charged with 358.0 g of bis(4-maleimidephenyl)methane, 68.5 g of p-aminophenol and 426.5 g of N,N-dimethylacetamide, and they were reacted at 140° C. for 5 hours to obtain a solution of a curing agent (A-3).

Production Example 4

Production of a Curing Agent (A-4)

A reactor having a volume of 1 liter which was equipped with a thermometer, a stirring device and a moisture determining device equipped with a reflux condenser and which could be heated and cooled was charged with 268.0 g of m-phenylenebismaleimide, 54.5 g of m-aminophenol and 322.5 g of N,N-dimethylacetamide, and they were reacted at 140° C. for 5 hours to obtain a solution of a curing agent (A-4).

Production Example 5

Production of a Curing Agent (A-5)

A reactor having a volume of 2 liter which was equipped with a thermometer, a stirring device and a moisture determining device equipped with a reflux condenser and which could be heated and cooled was charged with 408.0 g of bis(4-maleimidephenyl)sulfone, 54.5 g of p-aminophenol and 462.5 g of N,N-dimethylacetamide, and they were reacted at 100° C. for 2 hours to obtain a solution of a curing agent (A-5).

Production Example 6

Production of a Curing Agent (A-6)

A reactor having a volume of 2 liter which was equipped with a thermometer, a stirring device and a moisture determining device equipped with a reflux condenser and which could be heated and cooled was charged with 360.0 g of bis(4-maleimidephenyl) ether, 54.5 g of p-aminophenol and 414.5 g of N,N-dimethylacetamide, and they were reacted at 100° C. for 2 hours to obtain a solution of a curing agent (A-6).

Production Example 7

Production of a Curing Agent (A-7)

A reactor having a volume of 2 liter which was equipped with a thermometer, a stirring device and a moisture determining device equipped with a reflux condenser and which could be heated and cooled was charged with 570.0 g of 2,2'-bis[4-(4-maleimidephenoxy)phenyl]propane, 54.5 g of p-aminophenol and 624.5 g of propylene glycol monomethyl ether, and they were reacted at 120° C. for 2 hours to obtain a solution of a curing agent (A-7).

Production Example 8

Production of a Curing Agent (A-8)

A reactor having a volume of 2 liter which was equipped with a thermometer, a stirring device and a moisture determining device equipped with a reflux condenser and which could be heated and cooled was charged with 282.0 g of 4-methyl-1,3-phenylenebismaleimide, 54.5 g of p-aminophenol and 336.5 g of propylene glycol monomethyl ether, and they were reacted at 120° C. for 2 hours to obtain a solution of a curing agent (A-8).

Production Example 9

Production of a Copolymer Resin (C-1)

A reactor having a volume of 2 liter which was equipped with a thermometer, a stirring device and a moisture determining device equipped with a reflux condenser and which could be heated and cooled was charged with 514.0 g of a copolymer resin of styrene (m) and maleic anhydride (n) (trade name: EF-40, manufacture by Elf Atochem Co., Ltd., monomer ratio (m/n)=4.0, weight average molecular weight: 10,000), 462.6 g of cyclohexanone and 51.4 g of toluene. The reactor was heated up to 70° C. to homogeneously dissolve them, and then 46.5 g of aniline was dropwise added little by little. Next, the temperature was elevated up to the reflux temperature, and they were reacted for 5 hours while removing condensation water produced to obtain a solution of a copolymer resin (C-1) comprising styrene, maleic anhydride and N-phenylmaleimide. A monomer ratio m/(n+r) of styrene (m) of (C-1), maleic anhydride (n) and N-phenylmaleimide (r) was 4.0, and a weight average molecular weight thereof was 11,000.

Production Example 10

Production of a Copolymer Resin (C-2)

A reactor having a volume of 1 liter which was equipped with a thermometer, a stirring device and a moisture determining device equipped with a reflux condenser and which could be heated and cooled was charged with 154.0 g of a copolymer resin of isobutylene (m) and maleic anhydride (n) (trade name: Isobam-600, manufacture by Kuraray Co., Ltd., m/n=1.0, weight average molecular weight: 6,000), 308.0 g of N,N-dimethylacetamide and 30.8 g of toluene. The reactor was heated up to 70° C. to homogeneously dissolve them, and then 54.5 g of p-aminophenol was added little by little. Next, the temperature was elevated up to the reflux temperature, and they were reacted for 5 hours while removing condensation water produced to obtain a solution of a copolymer resin (C-2) comprising isobutylene, maleic anhydride and p-hydroxyphenylmaleimide. A monomer ratio m/(n+r) of isobutylene (m) of (C-2), maleic anhydride (n) and p-hydroxyphenylmaleimide (r) was 1.0, and a weight average molecular weight thereof was 7,000.

Comparative Production Example 1

Production of a Curing Agent (A-9)

Referring to examples in the patent document 1, a kneader having a volume of 1 liter which was equipped with a steam hating device was charged with 358.0 g of bis(4-maleimidephenyl)methane and 54.5 g of m-aminophenol, and the mixture was heated and kneaded at 135 to 140° C. for 15 minutes. Then, it was cooled down and crushed to obtain a powder of a curing agent (A-9).

Comparative Production Example 2

Production of a Curing Agent (A-10)

Referring to examples in the patent document 9, a kneader having a volume of 1 liter which was equipped with a steam hating device was charged with 358.0 g of bis(4-maleimidephenyl)methane and 68.5 g of m-aminobenzoic acid, and the mixture was heated and kneaded at 135 to 140° C. for 15 minutes. Then, it was cooled down and crushed to obtain a powder of a curing agent (A-10).

Examples 1 to 20 and Comparative Examples 1 to 8

Used were the curing agents (A-1 to 8) obtained in Production Examples 1 to 8 described above or the curing agents (A-9 and 10) obtained in Comparative Production Examples as the curing agent of the component (A) having an acidic substituent and an unsaturated maleimide group, benzoguanamine (manufactured by Nippon Shokubai Co., Ltd.) or dicyandiamide (manufactured by Kanto Chemical Co., Inc.) as the 6-substituted guanamine compound of the component (B), the copolymer resins (C-1 and 2) obtained in Production Examples 9 and 10 described above, a copolymer resin of styrene and maleic anhydride (C-3, trade name: EF-40, manufacture by Elf Atochem Co., Ltd., m/n=4.0, weight average molecular weight: 10,000) or a copolymer resin of isobutylene and maleic anhydride (C-4, trade name: Isobam-600, manufacture by Kuraray Co., Ltd., m/n=1.0, weight average molecular weight: 6,000) as the copolymer resin of the component (C), a phenol novolac type epoxy resin (D-1, trade name: Epicron N-770, manufacture by Dainippon Ink & Chemicals Inc.) or a dicyclopentadiene type epoxy resin (D-2, trade name: HP-7200H, manufacture by Dainippon Ink & Chemicals Inc.) as the epoxy resin of the component (D), a cresol novolac type phenol resin (trade name: KA-1165, manufacture by Dainippon Ink & Chemicals Inc.) as the epoxy curing agent, crushed silica (E-1, trade name: F05-30, manufacture by Fukushima Yogyo Co., Ltd., average particle diameter: 10 μm) and aluminum hydroxide (E-2, trade name: HD-365, manufacture by Showa Denko K.K., average particle diameter: 3 μm) as the inorganic filler of the component (E) and methyl ethyl ketone as the diluent solvent, and they were mixed in blend proportions (parts by mass) shown in Table 1 to Table 3 to obtain homogeneous vanishes having a resin content of 70% by mass.

Next, an E glass cloth having a thickness of 0.2 mm was impregnated and coated with the vanish obtained and heated and dried at 160° C. for 10 minutes to obtain a prepreg having a resin content of 55% by mass. Four sheets of the above prepregs were superposed, and electrolytic copper foils of 18 μm were disposed at the upper and lower sides and pressed at a pressure of 2.45 MPa and a temperature of 185° C. for 90 minutes to obtain a copper clad laminated plate.

The copper clad laminated plate thus obtained was used to measure and evaluate a copper foil adhesive property (copper foil peeling strength), a glass transition temperature (Tg), a solder heat resistance (T-288), a moisture absorption (water absorption coefficient), a flame retardation, a relative dielectric constant (1 GHz) and a dielectric loss tangent (1 GHz) by the methods described above. The evaluation results thereof are shown in Table 1 to Table 5.

TABLE 1

|  | Example |  |  |  |  |  |
|---|---|---|---|---|---|---|
|  | 1 | 2 | 3 | 4 | 5 | 6 |
| Thermosetting resin composition (parts by mass) Component (A) | | | | | | |
| Curing agent (A-1) | 40 | | | | 40 | |
| Curing agent (A-2) | | 40 | | | | 40 |
| Curing agent (A-3) | | | 40 | | | |
| Curing agent (A-4) | | | | 40 | | |
| Component (B) | | | | | | |
| Benzoguanamine | 10 | 10 | 10 | 10 | 10 | 10 |
| Component (C) | | | | | | |
| Copolymer resin (C-1) | 10 | | | | 10 | 10 |
| Copolymer resin (C-2) | | 10 | | | | |
| Copolymer resin (C-3) | | | 10 | | | |
| Copolymer resin (C-4) | | | | 10 | | |
| Component (D) | | | | | | |
| Phenol novolac type epoxy resin (D-1) | 40 | 40 | 40 | 40 | | |
| Cyclopentadiene type epoxy resin (D-2) | | | | | 30 | 30 |
| (Epoxy curing agent) | | | | | | |
| Cresol novolac type phenol resin | | | | | 10 | 10 |
| Component (E) | | | | | | |
| Crushed silica (E-1) | 10 | 10 | 10 | 10 | 10 | 10 |
| Aluminum hydroxide (E-2) | 80 | 80 | 80 | 80 | 80 | 80 |
| Measurement and evaluation results | | | | | | |
| (1) Copper foil adhesive property (copper foil peeling strength: kN/m) | 1.60 | 1.65 | 1.69 | 1.62 | 1.61 | 1.60 |
| (2) Glass transition temperature (Tg, °C.) | 230 | 225 | 228 | 230 | 230 | 235 |
| (3) Solder heat resistance | Good | Good | Good | Good | Good | Good |
| (4) Copper-stuck heat resistance (T-288, minute) | >60 | >60 | >60 | >60 | >60 | >60 |
| (5) Moisture absorption (water absorption coefficient: %) | 0.5 | 0.5 | 0.5 | 0.5 | 0.6 | 0.5 |
| (6) Flame retardation | V-0 | V-0 | V-0 | V-0 | V-0 | V-0 |
| (7) Relative dielectric constant (1 GHz) | 4.0 | 3.9 | 4.0 | 4.0 | 4.1 | 4.0 |
| (8) Dielectric loss tangent (1 GHz) | 0.004 | 0.004 | 0.004 | 0.005 | 0.005 | 0.005 |

TABLE 2

|  | Example |  |  |  |
|---|---|---|---|---|
|  | 7 | 8 | 9 | 10 |
| Thermosetting resin composition (parts by mass) Component (A) | | | | |
| Curing agent (A-5) | 40 | | | |
| Curing agent (A-6) | | 40 | | |
| Curing agent (A-7) | | | 40 | |
| Curing agent (A-8) | | | | 40 |
| Component (B) | | | | |
| Benzoguanamine | 10 | 10 | 10 | 10 |
| Component (C) | | | | |
| Copolymer resin (C-1) | 10 | | | |
| Copolymer resin (C-2) | | 10 | | |
| Copolymer resin (C-3) | | | 10 | |
| Copolymer resin (C-4) | | | | 10 |
| Component (D) | | | | |
| Phenol novolac type epoxy resin (D-1) | 40 | 40 | 40 | 40 |
| Cyclopentadiene type epoxy resin (D-2) | | | | |
| (Epoxy curing agent) | | | | |
| Cresol novolac type phenol resin | | | | |
| Component (E) | | | | |
| Crushed silica (E-1) | 10 | 10 | 10 | 10 |
| Aluminum hydroxide (E-2) | 80 | 80 | 80 | 80 |
| Measurement and evaluation results | | | | |
| (1) Copper foil adhesive property (copper foil peeling strength: kN/m) | 1.60 | 1.65 | 1.65 | 1.65 |

TABLE 2-continued

|  | Example | | | |
|---|---|---|---|---|
|  | 7 | 8 | 9 | 10 |
| (2) Glass transition temperature (Tg, ° C.) | 240 | 235 | 225 | 245 |
| (3) Solder heat resistance | Good | Good | Good | Good |
| (4) Copper-stuck heat resistance (T-288, minute) | >60 | >60 | >60 | >60 |
| (5) Moisture absorption (water absorption coefficient: %) | 0.5 | 0.5 | 0.5 | 0.5 |
| (6) Flame retardation | V-0 | V-0 | V-0 | V-0 |
| (7) Relative dielectric constant (1 GHz) | 4.0 | 3.8 | 3.7 | 4.1 |
| (8) Dielectric loss tangent (1 GHz) | 0.004 | 0.003 | 0.002 | 0.003 |

TABLE 3

|  | Example | | | | | |
|---|---|---|---|---|---|---|
|  | 11 | 12 | 13 | 14 | 15 | 16 |
| Thermosetting resin composition (parts by mass) | | | | | | |
| Component (A) | | | | | | |
| Curing agent (A-1) | 40 |  |  |  | 40 |  |
| Curing agent (A-2) |  | 40 |  |  |  | 40 |
| Curing agent (A-3) |  |  | 40 |  |  |  |
| Curing agent (A-4) |  |  |  | 40 |  |  |
| Component (B) | | | | | | |
| Dicyandiamide | 10 | 10 | 10 | 10 | 10 | 10 |
| Component (C) | | | | | | |
| Copolymer resin (C-1) | 10 |  |  |  | 10 | 10 |
| Copolymer resin (C-2) |  | 10 |  |  |  |  |
| Copolymer resin (C-3) |  |  | 10 |  |  |  |
| Copolymer resin (C-4) |  |  |  | 10 |  |  |
| Component (D) | | | | | | |
| Phenol novolac type epoxy resin (D-1) | 40 | 40 | 40 | 40 |  |  |
| Dicyclopentadiene type epoxy resin (D-2) |  |  |  |  | 30 | 30 |
| Component (E) | | | | | | |
| Crushed silica (E-1) | 10 | 10 | 10 | 10 | 10 | 10 |
| Aluminum hydroxide (E-2) | 80 | 80 | 80 | 80 | 80 | 80 |
| (Epoxy curing agent) | | | | | | |
| Cresol novolac type phenol resin |  |  |  |  | 10 | 10 |
| Measurement and evaluation results | | | | | | |
| (1) Copper foil adhesive property (copper foil peeling strength: kN/m) | 1.61 | 1.64 | 1.68 | 1.62 | 1.62 | 1.60 |
| (2) Glass transition temperature (Tg, ° C.) | 231 | 226 | 229 | 230 | 231 | 236 |
| (3) Solder heat resistance | Good | Good | Good | Good | Good | Good |
| (4) Copper-stuck heat resistance (T-288, minute) | >60 | >60 | >60 | >60 | >60 | >60 |
| (5) Moisture absorption (water absorption coefficient: %) | 0.6 | 0.5 | 0.5 | 0.5 | 0.6 | 0.5 |
| (6) Flame retardation | V-0 | V-0 | V-0 | V-0 | V-0 | V-0 |
| (7) Relative dielectric constant (1 GHz) | 4.1 | 3.9 | 4.0 | 4.0 | 4.2 | 4.1 |
| (8) Dielectric loss tangent (1 GHz) | 0.004 | 0.004 | 0.004 | 0.005 | 0.005 | 0.005 |

TABLE 5

|  | Comparative Example | | | | | |
|---|---|---|---|---|---|---|
|  | 1 | 2 | 3 | 4 | 5 | 6 |
| Thermosetting resin composition (parts by mass) Component (A) | | | | | | |
| Curing agent (A-1) |  |  | 40 |  | 40 |  |
| Curing agent (A-9) | 40 |  |  | 40 |  | 40 |
| Curing agent (A-10) |  | 40 |  |  |  |  |
| Component (B) | | | | | | |
| Benzoguanamine | 10 | 10 |  |  | 10 | 10 |
| Component (C) | | | | | | |
| Copolymer resin (C-3) | 10 |  |  |  |  |  |
| Copolymer resin (C-4) |  | 10 |  |  |  |  |
| Component (D) | | | | | | |
| Phenol novolac type epoxy resin (D-1) | 40 | 40 |  |  |  |  |
| Cyclopentadiene type epoxy resin (D-2) |  |  | 50 | 50 | 40 | 40 |
| (Epoxy curing agent) Cresol novolac type phenol resin |  |  | 10 | 10 | 10 | 10 |
| Component (E) | | | | | | |
| Crushed silica (E-1) | 10 | 10 | 10 | 10 | 10 | 10 |
| Aluminum hydroxide (E-2) | 80 | 80 | 80 | 80 | 80 | 80 |
| Measurement and evaluation results | | | | | | |
| (1) Copper foil adhesive property (copper foil peeling strength: kN/m) | 0.90 | 0.90 | 0.70 | 0.45 | — | — |
| (2) Glass transition temperature (Tg, °C.) | 140 | 150 | 130 | 120 | — | — |
| (3) Solder heat resistance | Blister | Blister | Blister | Blister | — | — |
| (4) Copper-stuck heat resistance (T-288, minute) | 1 | 1 | 1 | 0 | — | — |
| (5) Moisture absorption (water absorption coefficient: %) | 1.1 | 1.1 | 0.8 | 1.1 | — | — |
| (6) Flame retardation | V-0 | V-1 | V-1 | Burned | — | — |
| (7) Relative dielectric constant (1 GHz) | 4.9 | 4.9 | 5.1 | 5.1 | — | — |
| (8) Dielectric loss tangent (1 GHz) | 0.014 | 0.014 | 0.017 | 0.023 | — | — |

In Comparative Examples 5 and 6, the vanishes in which the thermosetting resin composition was homogeneously dissolved were not obtained, and the prepregs could not be produced.

As apparent from the results shown in Table 1 to Table 4, a balance is kept in all of a copper foil adhesive property (copper foil peeling strength), a glass transition temperature (Tg), a solder heat resistance (T-288), a moisture absorption (water absorption coefficient), a flame resistance, a relative dielectric constant (1 GHz) and a dielectric loss tangent (1 GHz) in the examples of the present invention.

On the other hand, as apparent from the results shown in Table 5, the prepregs cannot be produced in the comparative examples or the laminated plates which are balanced in all of a copper foil adhesive property, a glass transition temperature, a solder heat resistance, a moisture absorption, a flame resistance, a relative dielectric constant and a dielectric loss tangent are not found, and they are inferior in any of the characteristics.

The prepregs obtained by impregnating or coating the base material with the thermosetting resin compositions of the present invention and the laminated plates produced by laminating and molding the above prepregs are balanced in all of a copper foil adhesive property, a glass transition temperature, a solder heat resistance, a moisture absorption, a flame resistance, a relative dielectric constant and a dielectric loss tangent, and they are useful as a printed wiring board for electronic instruments.

What is claimed is:

1. A thermosetting resin composition comprising:

(A) a curing agent having an acidic substituent and an unsaturated maleimide group which is produced by reacting (a-1) a maleimide compound having at least two N-substituted maleimide groups in a molecule with (a-2) an amine compound having an acidic substituent represented by the following Formula (1) in an organic solvent, a use amount of the organic solvent being 10 to 1000 parts by mass per 100 parts by mass of the sum of the maleimide compound (a-1) and the amine compound (a-2), (B) a 6-substituted guanamine compound represented by the following Formula (2) and/or dicyandiamide, (C) a copolymer resin comprising (c-1) a monomer unit represented by the following Formula (3) and (c-2) a monomer unit represented by the following Formula (4), and (D) an epoxy resin having at least two epoxy groups in a molecule:

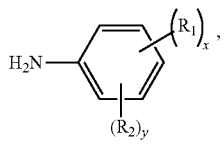
(1)

wherein $R_1$ each represents independently an acidic substituent selected from a hydroxyl group, a carboxy group and a sulfonic acid group; $R_2$ each represents independently a hydrogen atom, an aliphatic hydrocarbon group having 1 to 5 carbon atoms or a halogen atom; x is an integer of 1 to 5, and y is an integer of 0 to 4; and a sum of x and y is 5;

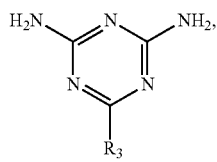
(2)

wherein $R_3$ represents phenyl, methyl, allyl, butyl, methoxy or benzyloxy;

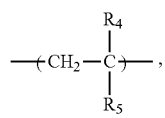
(3)

wherein $R_4$ and $R_5$ each represent independently a hydrogen atom, a halogen atom, a hydrocarbon group having 1 to 5 carbon atoms, a phenyl group or a substituted phenyl group;

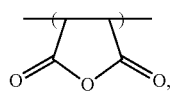
(4)

wherein the curing agent (A) comprises a compound represented by the following Formula (5) or the following Formula (6):

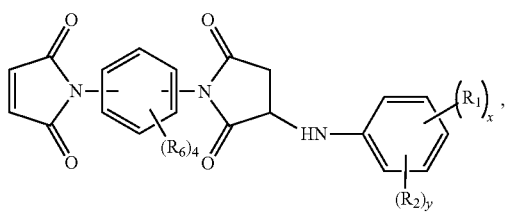
(5)

wherein $R_1$, $R_2$, x and y represent the same ones as in Formula (1); $R_6$ each represents independently a hydrogen atom, an aliphatic hydrocarbon group having 1 to 5 carbon atoms or a halogen atom;

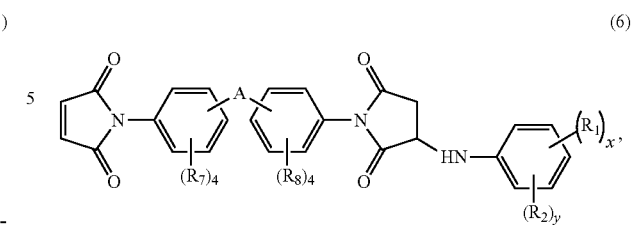
(6)

wherein $R_1$, $R_2$, x and y represent the same ones as in Formula (1); $R_7$ and $R_8$ each represents independently a hydrogen atom, an aliphatic hydrocarbon group having 1 to 5 carbon atoms or a halogen atom; and A is an alkylene group, an alkylidene group, an ether group, a sulfonyl group or a group represented by the following Formula (7):

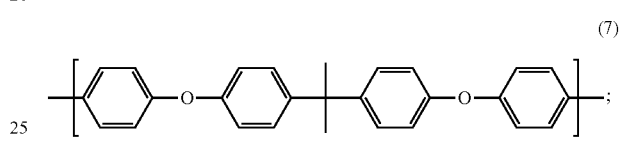
(7)

and the organic solvent.

2. The thermosetting resin composition according to claim 1, wherein an equivalent ratio of (a-1) the maleimide compound and of (a-2) the amine compound used in the organic solvent falls within a range of 1.0≤(equivalent of maleimide group in (a-1) the maleimide compound/equivalent of (a-2) the amine compound in terms of —NH₂ group)≤10.0.

3. The thermosetting resin composition according to claim 1, which includes 1 to 95 parts by mass of component (A) based on 100 parts by mass of the sum of the masses of the component (A) having an acidic substituent and an unsaturated maleimide group in terms of a solid matter and masses of the components (B)-(D).

4. The thermosetting resin composition according to claim 3, which also includes 1 to 95 parts by mass of the component (B), 1 to 50 parts by mass of the component (C), and 1 to 95 parts by mass of the component (D), each based on 100 parts by mass of said sum.

5. The thermosetting resin composition according to claim 1, wherein said maleimide compound is bis(4-maleimidephenyl)methane, and said amine compound is m-aminophenol.

6. The thermosetting resin composition according to claim 1, wherein said maleimide compound is selected from the group consisting of bis(4-maleimidephenyl)methane, m-phenylenebismaleimide and bis(4-maleimidephenyl)sulfone, and said amine compound is selected from the group consisting of m-aminophenol and p-aminophenol.

7. The thermosetting resin composition according to claim 1, wherein the component (B) includes the 6-substituted guanamine compound, the 6-substituted guanamine compound being selected from the group consisting of benzoguanamine and 2,4-diamino-6-vinyl-s-triazine.

8. The thermosetting resin composition according to claim 1, which consists essentially of (A) the curing agent, (B) the 6-substituted guanamine compound and/or dicyandiamide, (C) the copolymer resin and (D) the epoxy resin.

9. The thermosetting resin composition according to claim 1, wherein said organic solvent is selected from the group consisting of cyclohexanone, propylene glycol monomethyl ether, and methyl cellosolve.

10. The thermosetting resin composition according to claim 1, wherein the use amount of the organic solvent is 200 to 500 parts by mass per 100 parts by mass of the sum of the maleimide compound (a-1) and the amine compound (a-2).

11. The thermosetting resin composition according to claim 1, wherein said organic solvent is selected from the group consisting of dimethylacetamide and propylene glycol monomethyl ether.

12. A prepreg obtained by impregnating or coating a base material with the thermosetting resin composition according to claim 1 and then subjecting it to a B stage.

13. A laminated plate obtained by laminating and molding the prepreg according to claim 12.

14. The laminated plate according to claim 13, wherein it is a metal clad laminated plate obtained by superposing a metal foil on one side of the prepreg and then heating, pressing and molding it.

* * * * *